US006333134B1

(12) United States Patent
Taguchi et al.

(10) Patent No.: US 6,333,134 B1
(45) Date of Patent: Dec. 25, 2001

(54) MULTILAYERED PHOTOPOLYMER ELEMENT INCLUDING SENSITIVITY CONTROLLING AGENTS

(75) Inventors: Yuji Taguchi; Toshiaki Fujimura; Hajime Kouda, all of Ohtsu (JP)

(73) Assignee: Toyo Boseki Kabushiki Kaisha, Osaka (JP)

(*) Notice: Subject to any disclaimer, the term of this patent is extended or adjusted under 35 U.S.C. 154(b) by 0 days.

(21) Appl. No.: 09/614,120

(22) Filed: Jul. 11, 2000

Related U.S. Application Data

(63) Continuation of application No. 08/230,702, filed on Apr. 21, 1994, now abandoned.

(30) Foreign Application Priority Data

Apr. 30, 1993 (JP) .................................................. 5-104269

(51) Int. Cl.⁷ .................................................. G03C 1/492
(52) U.S. Cl. .................................. 430/270.1; 430/273.1; 430/906
(58) Field of Search .............................. 430/271.1, 273.1, 430/906

(56) References Cited

U.S. PATENT DOCUMENTS

| 2,868,124 | 1/1959 | Crawford | 101/401.1 |
|---|---|---|---|
| 2,951,758 | 9/1960 | Notley | 96/35 |
| 2,993,789 | 7/1961 | Crawford | 96/35 |
| 3,036,915 | 5/1962 | Notley | 96/84 |
| 3,036,916 | 5/1962 | Notley | 96/84 |
| 3,149,975 | 9/1964 | Notley | 96/115 |
| 3,157,505 | 11/1964 | Notley | 96/68 |
| 3,861,921 | 1/1975 | Hoffman et al. | 430/273 |
| 5,024,919 | 6/1991 | Yamauchi | 430/273 |
| 5,130,392 | 7/1992 | Schwalm et al. | 430/270 |
| 5,204,223 | * 4/1993 | Taguchi et al. | 430/280.1 |
| 5,250,393 | * 10/1993 | Imai et al. | 430/302 |
| 5,298,361 | * 3/1994 | Bonham | 430/260 |

FOREIGN PATENT DOCUMENTS

| 35/16614 | 11/1960 | (JP) . |
|---|---|---|
| 37/1306 | 5/1962 | (JP) . |
| 50/16055 | 6/1975 | (JP) . |
| 53/36555 | 4/1978 | (JP) . |
| 55/79437 | 6/1980 | (JP) . |
| 55/153935 | 12/1980 | (JP) . |
| 55/153945 | 12/1980 | (JP) . |
| 58/117537 | 7/1983 | (JP) . |
| 58/140737 | 8/1983 | (JP) . |
| 61/56506 | 12/1986 | (JP) . |
| 04/97154 | 3/1992 | (JP) . |

* cited by examiner

Primary Examiner—Mark Chapman
(74) Attorney, Agent, or Firm—Foley & Lardner

(57) ABSTRACT

A multilayered photopolymer element made up of at least a support, a photosensitive layer and a cover film. The photosensitive layer is composed of at least two layers and the uppermost layer in the photosensitive layer contains a sensitivity controlling agent bonded with a polymer. The shape of the shoulder at a relief top is made sharp-edged whereby a printing plate having excellent print quality without being thickened by impression is prepared.

9 Claims, No Drawings

MULTILAYERED PHOTOPOLYMER ELEMENT INCLUDING SENSITIVITY CONTROLLING AGENTS

This application is a continuation, of application Ser. No. 08/230,702, filed Apr. 21, 1994, now abandoned.

The present invention relates to a multilayered photopolymer element wherein photopolymerizable photosensitive layers are provided on a support which is made of metal or plastic. More particularly, it relates to a multilayered photopolymer element by which it is possible to give a printing plate having a sharp-edged shape at a relief top and providing excellent print quality without a thickening by impression.

It has been already known to prepare printing plates by forming a letterpress using a photosensitive resin and that print quality is greatly dependent upon the hardness of the photosensitive resin layers. When the photosensitive resin layer is hard, deformation at the relief top is small. Therefore, though reproductivity of fine lines, dots and images is excellent, ink transferability is not good and there is a tendency for images with a large area to become blurred. In order to overcome such a disadvantage, printing is conducted with a high impression but another problem of thickening of fine lines and dots results. On the other hand, when the photosensitive resin layer is soft, the ink transferability is good but the relief top is apt to be deformed by printing pressure and, accordingly, there is a problem that the image is apt to become thick.

Accordingly, hardness of the photosensitive resin layers is chosen depending upon the aimed printing field. However, it has been difficult to solve both of the above-mentioned problems caused by hardness of the photosensitive resin layers.

In order to solve the above problems, there has been a proposal to add a sensitivity controlling agent which controls the sensitivity to the upper layer of the photosensitive resin layers whereby the shape of the relief is made sharp-edged. A specific example of such a proposal is that the photosensitive resin is provided in a multilayered manner in which the thermal polymerization inhibitor in the layers is successively made in larger amounts from the lower to the upper layers so that the shape of the shoulder at the relief top has a sharp-edge and a sharp printed image without thickening results (cf. Examined Japanese Publications No. 35/16614 and No. 37/1306). However, in such a method, there is a disadvantage that, when the unexposed photopolymer plate is stored for long time, the thermal polymerization inhibitor with a low molecular weight migrates to the lower layers whereupon the effect of making the shape of the shoulder sharp is lost. On the other hand, there has been another proposal for giving a sharp print of high quality without thickening using a photosensitive resin latterpress in which a relief is composed of a base layer comprising a certain soft photosensitive resin layer and a top layer comprising a hard one (cf. Examined Japanese Publication No. 61/56506). However, the material for such a photosensitive resin letterpress has the defect that, when it is in a form of a solid plate, manufacture of the multilayered structure is difficult and, when unexposed photopolymer plate is stored for long time, a crosslinking agent which is used for making the hardness between the laminated layers different migrates between the layers resulting in a deterioration of quality.

The object of present invention is to solve the problems in the conventional photosensitive resin letterpress and to provide a multilayered photopolymer element whereby the shelf life of unexposed photopolymer plates is extended and a printed image which does not thicken but is sharp can be achieved.

In order to solve the above-mentioned problems, the present inventors have carried out extensive studies and have at last achieved the present invention. Thus the present invention relates to a multilayered photopolymer element comprising at least a support, a photosensitive layer and a cover film which is characterized in that there are at least two photosensitive layers and the uppermost layer of said photosensitive layers contains a sensitivity controlling agent bonded with a polymer.

With regard to the photosensitive resin composition used in the photosensitive resin layer comprising at least two layers in the present invention, it is possible to use known photosensitive resin compositions such as a composition wherein a polyether amide is used as a polymeric binder (e.g. Japanese Laid-Open Publication No. 55/79437); a composition wherein a polyether ester amide is used as a polymeric binder (e.g. Japanese Laid-Open No. 58/117537); a composition wherein a polyamide having a tertiary nitrogen is used as a polymeric binder (e.g. Japanese Laid-Open No. 50/76055); a polyamide containing a quarternary ammonium (e.g. Japanese Laid-Open Publication No. 53/36555); an addition polymer of an amide having one or more amide bond(s) with an organic diisocyanate compound (e.g. Japanese Laid-Open No. 58/140737); an addition polymer of a diamine having no amide bond with an organic diisocyanate compound (e.g. Japanese Laid-Open No. 04/97154); etc.

The photosensitive resin layer in accordance with the present invention is composed of at least two layers and it is sufficient that the uppermost layer thereof contains a sensitivity controlling agent bonded with a polymer. Incidentally, it is not necessary that other components are contained from the initial stage but may migrate from the lower layers. Specific examples of the sensitivity controlling agent are known photopolymerization inhibitors, thermal polymerization inhibitors, ultraviolet absorbers, compounds which improve the sensitivity balance (Japanese Laid-Open Publication No. 55/153945), etc. and it is preferred that they contain functional groups necessary for bonding with the polymer such as an amino group, epoxy group, hydroxy group, isocyanate group, etc. When direct reaction with the polymer is difficult, they may be further compounded with a binder for binding a high-molecular active hydrogen with a sensitivity controlling agent such as a diepoxy compound, a diisocyanate compound, etc.

Specific examples of thermal polymerization inhibitors which may be used as a sensitivity controlling agent are the compounds having a thermal polymerization inhibiting ability and having one or more functional group(s) capable of reacting with the polymer. More specific examples are hydroquinone derivatives, hydroquinone monomethyl ether derivatives, benzoquinone derivatives, derivatives of aromatic amine compounds, catechol derivatives, derivatives of nitro compounds, derivatives of sulfur compounds, etc.

Examples of the ultraviolet absorbers which may be used as sensitivity controlling agents are the compounds having an ultraviolet absorbing ability and having one or more functional group(s) for making the molecular weight higher. Specific examples thereof are azobenzene derivatives (e.g. p-aminoazobenzene, chrysoidine, etc.), benzothiazole derivatives (e.g. 2-(p-aminophenyl)-6-methylbenzothiazole, primulin, etc.), stilbene derivatives (e.g. p-nitroaniline, 4-nitro-o-anisidine, etc.), acridine derivatives (e.g. 9-aminoacridine, etc.) and the like.

The sensitivity balancing agents which may be used as sensitivity controlling agents are the compounds exhibiting an ability of improving the sensitivity balance and having one or more functional group(s) for making molecular weight higher. Specific examples thereof are aminonaphthoquinone derivatives which are disclosed in the Japanese Laid-Open Publication No. 55/153935.

It is essential that the sensitivity controlling agent compounded in accordance with the present invention is bonded with a polymer and, with regard to the polymer which is bonded with the functional group of the sensitivity controlling agent, it is possible to use known soluble polymers having active hydrogens at the terminals thereof. Specific examples are polyether amides, polyether ester amides, polyamides containing tertiary nitrogens, polyamides containing quarternary nitrogen, addition polymers of diamine having an amide bond with an organic diisocyanate, addition polymers of diamine having no amide bond with an organic diisocyanate compound, polyvinyl alcohol, graft polymers of polyvinyl alcohol with ethylene oxide, etc. The above-mentioned soluble polymers may be bonded with the functional groups of the sensitivity controlling agent either during or after the polymerization of the soluble polymers. The polymer which is bonded with the sensitivity controlling agent may be the same as or different from that which is contained in the photosensitive resin composition in the lower layer but, when the adhesion between the lower and the upper layers is taken into consideration, it is preferred that those polymers are same.

Incidentally, the amount of the sensitivity controlling agent may vary depending upon each of the compositions and may be decided from the shape of the shoulder of the relief and also from the thickening during the printing.

Then, with regard to a method of preparing the multi-layered photopolymer element, i.e. that which is composed of at least a support, a photosensitive layer containing a sensitivity controlling agent in the uppermost layer and a cover film, known molding methods may be applied. Specific examples thereof are a method in which upper and lower photosensitive layers containing a sensitivity controlling agent which are separately molded by a casting method are laminated; a method in which a layer containing a sensitivity controlling agent and a lower layer are subjected to a co-extrusion molding at the molding stage; a method in which a layer containing a sensitivity controlling agent is cast on a lower layer molded by a casting method whereby a multi-layered photopolymer element is prepared; a method in which an upper layer containing a sensitivity controlling agent and resulting is a photosensitivity after lamination is laminated by a known manner on a lower layer molded by an extrusion molding or a casting method.

The reason why the multilayered photopolymer element of the present invention changes little in its relief shape even on long storage is probably due to that fact that the sensitivity controlling agent which is contained in the upper layer of the photosensitive layer is bonded with a polymer whereby is does not migrate into the lower layers.

The present invention will now be specifically illustrated by way of the following examples though the present invention is not limited thereto. The term "part" used in the examples means parts by weight. Incidentally, developing time and an evaluation of the printing quality after molding into the multilayers of the present invention were measured by the following methods.

Developing Time: Development was conducted using a brush type washer (the brush used was made of nylon and was with a diameter of 120 microns) in which a neutral water of 25° C. was placed and the time necessary for removing the unexposed parts was measured. With regard to the brush type washer, that for A2 size manufactured by Japan Electric Machine Co. (JW-A2-PD) was used.

Evaluation of Print Quality: Printing was conducted using an ink of CM-ace (light indigo ink) of Miyako Ink KK, a wood free paper of Sanyo Kokusaku Pulp and a rotary press of Ukita Kogyo KK (type BF-201) at a printing speed of 100 m/minute. Then the thickening of the printed letters was judged by the naked eye and also the width of the 100 micron lines on the negative film was compared.

EXAMPLE 1

N,N'-Bis(3-aminopropyl)piperazine (20 parts) and 0.05 part of aminonaphthoquinone (a sensitivity controlling agent with a molecular weight of 274) represented by the following structural formula were dissolved in 233 parts of methanol and then 80 parts of a urethane oligomer (having isocyanate groups substantially at both terminals; obtained by the reaction of 500 parts of polyethylene glycol [average molecular weight: 1000] with 185 parts of hexamethylene diisocyanate) was gradually added thereto with stirring.

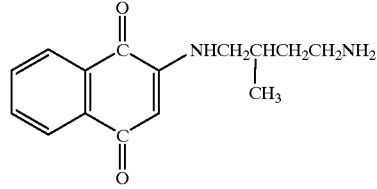

Reaction between them finished within about ten minutes. The polymer solution prepared as such in which a sensitivity controlling agent was bonded with a part of the polymer was taken in a Petri dish coated with Teflon, methanol was removed by evaporation and the residue was dried in vacuo. The resulting polymer was soluble in water and was with a specific viscosity of 1.80.

The polymer (55 parts) prepared as such was dissolved in 200 parts of methanol of 60° C., 2 parts of glycidyl methacrylate was added and the mixture was stirred for three hours so that the glycidyl methacrylate was made to react with the polymer terminals. After that, 29 parts of diacrylate (prepared by a ring-opening addition reaction of acrylic acid with diglycidyl ether of polyethylene glycol with an average molecular weight of 400), 15 parts of N-butylbenzene sulfonamide, 0.1 part of hydroquinone monomethyl ether and 1.0 part of benzyl dimethyl ketal were added to give a solution of a photosensitive resin composition. The solution of this photosensitive resin composition was coated on a surface of a polyester film (thickness: 125 microns; coated with poval of 98% saponification degree to a thickness of about 1.6 microns) using a wire bar and dried in a drier of 100° C. for three minutes to give a cover film on which a photosensitive resin composition (containing a polymer bonded with the sensitivity controlling agent) was coated in a thickness of 40 microns.

In the meanwhile, the lower layer was prepared as follows. Thus, 87 parts of N,N'-bis(3-aminopropyl)piperazine was dissolved in 600 parts of methanol, 353 parts of urethane oligomer (having isocyanate groups substantially at its both terminals prepared by the reaction of 500 parts of polyethylene glycol [average molecular weight: 1,000] with 185 parts of hexamethylene diisocyanate) was gradually added thereto with stirring and the mixture was made to react for about ten minutes to complete the reaction. The solution was placed in a Petri dish which was coated with Teflon, methanol was removed therefrom by evaporation and the residue was dried in vacuo. The resulting polymer (55 parts) was dissolved in 200 parts of methanol of 60° C., 2 parts of glycidyl methacrylate was added and the mixture was stirred for three hours so that the glycidyl methacrylate was made to react with the polymer terminals. After that, 29 parts of diacrylate (prepared by a ring-opening addition reaction of acrylic acid with diglydicyl ether of polyethlene glycol of average molecular weight of 400), 15 parts of N-butylbenzene sulfonamide, 0.1 part of hydroquinone monomethyl ether and 1.0 part of benzyl dimethyl ketal were added thereto to give a solution of a photosensitive resin composition. This solution was flowed into a Petri dish which was coated with Teflon, methanol was removed therefrom by evaporation in a dark place and the residue was dried in vacuo at 40° C. for a whole day and night to give a sheet of the composition with a thickness of about 800 microns. The resulting sheet was stuck together with a polyester film (thickness: 188 microns) which was coated with an adhesive containing a brown pigment, then the upper surface of the composition was covered with the above-prepared cover film to which the photosensitive resin composition containing a polymer bonded with a sensivity controlling agent was coated in a thickness of 40 microns and then they were thermally compressed at 110° C. to give an unexposed photopolymer plate in which the thickness of the photosensitive resin layer was about 700 microns.

After seven days from the preparation of the unexposed photopolymer plate, the cover film was removed from the plate, a negative film was closely adhered to the surface of the photosensitive resin surface, exposed to light by means of a chemical lamp for three minutes, the negative film was detached, developed with a neutral water in a brush type washer for 2 minutes and 25 seconds, dried, and exposed to light to give a relief. The printing quality of this relief was evaluated and it was found that the print had little thickening and the letters were sharp as well. A printed line from a line with a width of 100 microns was measured and found to be with a width of 125 microns.

After three months from the preparation of the unexposed photopolymer plate, the printing quality was evaluated and it was found that the print had little thickening and the line image was sharp as well. When the line with a width of 100 microns was measured, it was printed as a line of 122 microns.

Comparative Example 1

In order to compare with a sensitivity controlling agent which was not fixed with a polymer, a polymer was prepared by the same manner as in Example 1 without compounding with the sensitivity controlling agent. The resulting polymer (55 parts) was dissolved in 200 parts of methanol of 60° C., 2 parts of glycidyl methacrylate was added and the mixture was stirred for three hours so that glycidyl methacrylate was made to react with the polymer terminals. Then 29 parts of diacrylate (prepared by a ring-opening addition reaction of acrylic acid with diglycidyl ether of polyethylene glycol with an average molecular weight of 400), 15 parts of N-butylbenzene sulfonamide, 0.1 part of hydroquinone monomethyl ether, 1.0 part of benzyl dimethyl ketal and 0.05 part of a sensitivity controlling agent of Example 1 in which the terminals were amino groups and were not bonded with the polymer were added thereto to give a solution of a photosensitive resin composition. The solution of this photosensitive controlling agent was coated on a polyester film of 125 micron thickness (coated with poval of 98% degree of saponification to a thickness of about 1.6 microns) using a wire bar and dried in a drier of 100° C. for three minutes to give a cover film which was coated with a photosensitive resin composition containing a sensitivity controlling agent which was not bonded with a polymer.

On the other hand, the lower layer was prepared as follows. Thus, a sheet of a photosensitive resin composition with a thickness of about 800 microns was obtained in the same manner as in Example 1. The resulting sheet was adhered together with a polyester film (thickness: 188 microns) which was coated with an adhesive containing a brown pigment, then the upper surface of the composition was covered with a cover film which was coated to an extent of 50 microns with a previously-prepared photosensitive resin composition containing a polymer which was not bonded with a sensitivity controlling agent and subjected to a thermal compressing at 110° C. to give an unexposed photopolymer plate in which the thickness of the photosensitive resin layer was about 700 microns.

Then the cover film was removed from this photopolymer plate, a negative film was closely adhered to the surface of the photosensitive resin layer, exposed to light by means of a chemical lamp for three minutes, the negative film was detached, developed with a neutral water for 2 minutes and 25 seconds in a brush type washer, dried and exposed to light to give a relief. In the meanwhile, after one day from the preparation of the unexposed photopolymer plate, the cover film was detached from this plate, a negative film was closely adhered to the surface of the photosensitive resin layer, exposed to light by means of a chemical lamp for three minutes, the negative film was detached, developed with a neutral water in a brush type washer for 2 minutes and 25 seconds, dried and exposed to light to give a relief. The print quality of this relief was evaluated and it was found that the print had little thickening, the letters were sharp and a line with a width of 100 microns was printed at a width of 132 microns. However, when the same evaluation on the print quality was conducted after three months from the preparation of the unexposed photopolymer plate by the same manner as that conducted after one day, the print had thickened and a line with a width of 100 microns was printed at a width of 195 microns.

Comparative Example 2

As a sensitivity controlling agent which is not fixed with a polymer, 0.05 part of an aminonaphthquinone derivative having the following chemical structure was used and a solution containing a photosensitive resin was prepared in the same manner as in Comparative Example 1.

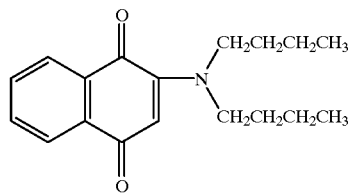

The solution of this photosensitive resin composition was coated on a surface of a polyester film (thickness: 125 microns;

coated with poval of 98% of degree of saponification to an extent of about 1.6 microns) using a wire bar and dried in a drier of 100° C. for three minutes to give a film which was coated with a photosensitive resin composition (thickness: 40 microns) containing a sensitivity controlling agent which was not bonded with a polymer.

With regard to the lower layer, a sheet of the composition with a thickness of about 800 microns was prepared in the same manner as in Example 1. The resulting sheet was adhered together with a polyester film (thickness: 188 microns) coated with an adhesive containing a brown pigment, then covered with a cover film of Comparative Example 2 which was coated with a photosensitive resin composition (thickness: 40 microns) containing a sensitivity controlling agent and a polymer which was not bonded with the sensitivity controlling agent and subjected to a thermal compression to give an unexposed photopolymer plate in which the thickness of the photosensitive resin layer was about 700 microns.

After seven days from the preparation of the unexposed photopolymer plate, the cover film was detached from this plate, then a negative film was closely adhered with the surface of the photosensitive resin layer, exposed to light by means of a chemical lamp for three minutes, the negative film was detached, developed with a neutral water in a brush type washer for 2 minutes and 25 seconds, dried and exposed to light to give a relief. Printing quality of this relief was evaluated and it was found that the print was thickened and there were some letters which were illegible.

EXAMPLE 2

The same operation as in Example 1 was carried out with the exception that 0.05 part of an ultraviolet absorber containing an amino group in the molecule [2-(4-aminophenyl)-6-methylbenzo-thiazole] was added instead of a sensitivity controlling agent fixed with a polymer to give a polymer wherein the ultraviolet absorber was fixed with a part of the polymer. The resulting polymer (55 parts) was dissolved in 200 parts at methanol at 60° C., 2 parts of glycidyl methacrylate was added and the mixture was stirred for three hours so that glycidyl methacrylate was made to react with the terminals of the polymer. After that, 29 parts of diacrylate (prepared by a ring-opening addition reaction of acrylic acid with diglycidyl ether of polyethylene glycol of an average moleculer weight of 400), 15 parts of N-butylbenzene sulfonamide, 0.1 part of hydroquinone monomethyl ether, 1.0 part of benzyl dimethyl ketal and 0.05 part of the sensitivity controlling agent used in Example 1 (wherein the terminal was an amino group and was not fixed with a polymer) were added to give a solution of a photosensitive resin composition. The solution of this photosensitive resin composition was coated on a coated surface of the polyester film (which was coated with poval of degree of saponification of 98% to a thickness of about 1.6 microns) using a wire bar and dried in a drier of 100° C. for three minutes to give a film to which the photosensitive resin composition containing the ultraviolet absorber bonded with the polymer to a thickness of 40 microns.

The same operation as in Example 1 was carried out with an exception that the film which was coated with the above-mentioned photosensitive resin composition containing the ultraviolet absorber was used instead of the cover film of Example 1 to prepare a lower layer. This was subjected to a thermal compression to the already-prepared upper layer film at 110° C. to give an unexposed photopolymer plate in which the thickness of the photosensitive resin layer is about 700 microns. Then the cover film was detached from this plate, a negative film was closely adhered with the surface of the photosensitive resin layer, exposed to light by means of a chemical lamp, the negative film was detached, developed by a neutral water using a brush type washer for 2 minutes and 25 seconds, dried and exposed to light to give a relief.

After one day from the preparation of the unexposed photopolymer plate, the cover film was detached from this plate, a negative film was closely adhered with the surface of the photosensitive resin layer, exposed to light by means of a chemical lamp for three minutes, the negative film was detached, developed with a neutral water by a brush type washer for 2 minutes and 25 seconds, dried and exposed to light to give a relief. The print quality of this relief was evaluated and it was found that the print was with little thickening and the letters were sharp as well. When the line with a width of 100 microns was measured, it was printed in a width of 133 microns. After three days from the preparation of the photosensitive resin composition, the evaluation on the print quality was carried out by the same manner as that of one day after the preparation whereby the print had little thickening and the letters were sharp as well. The line with a width of 100 microns was printed at a width of 130 microns.

EXAMPLE 3

The same operation as in Example 1 was carried out with an exception that 0.05 part of p-aminoazobenzene (the ultraviolet absorber having an amino group in a molecule) was added instead of the sensitivity controlling agent used for the fixing the polymer in Example 1 to give a polymer in which the ultraviolet absorber was fixed with a part of the polymer. The resulting polymer (55 parts) was dissolved in 200 parts of methanol of 60° C., 2 parts of glycidyl methacrylate was added and the mixture was stirred for three hours so that the glycidyl methacrylate was made to react with the polymer terminals. After that, a solution of a photosensitive resin composition containing 29 parts of a diacrylate (prepared by a ring-opening addition reaction of acrylic acid with diglycidyl ether of polyethylene glycol of an average moleculer weight of 400), 15 parts of N-butylbenzene sulfonamide, 0.1 part of hydroquinone monomethyl ether, 1.0 part of benzyl dimethyl ketal and 0.05 part of the above-prepared ultraviolet absorber having amino groups at the terminals and being fixed with the polymer was obtained.

With regard to the lower layer, a solution of a photosensitive resin composition was obtained in the same manner as in Example 1. The solution was flowed over a polyester film at a thickness of 188 microns coated with an adhesive containing a brown pigment, methanol was removed therefrom by evaporation and the residue was further dried in vacuo at 40° C. for a whole day and night to give a sheet of the composition with a thickness of about 700 microns. After that, a methanolic solution of the photosensitive resin composition containing 0.05 part of the ultaviolet absorber fixed with the polymer which was prepared already was flowed onto the above upper layer to make the thickness of the photosensitive layer 40 microns, methanol was removed therefrom by evaporation in a dark place and the residue was further dried in vacuo at 40° C. for a whole day and night. The dry surface of the resulting photosensitive layer was thermally stuck together with a polyester film (thickness: 125 microns; coated with poval of degree of saponification of 98% to a thickness of about 1.6 microns) at 80° C. to give an unexposed photopolymer plate in which the thickness of the photosensitive layer was about 700 microns.

Then the cover film was detached from this plate, a negative film was closely stucked to the surface of the photosensitive resin layer, exposed to light by means of a chemical lamp for three minutes, the negative film was detached, developed with a neutral water in a brush type washer for 2 minutes and 10 seconds, dried and exposed to light to give a relief.

After one day from the preparation of the photopolymer plate, the cover film was detached from this plate, a negative film was closely stucked to the surface of the photosensitive resin layer, exposed to light by means of a chemical lamp for three minutes, the negative film was detached, developed with a neutral water in a brush type washer for 2 minutes and 25 seconds, dried and exposed to light to give a relief. The print quality of this relief was evaluated and it was found that the print had little thickening and the letters were sharp as well. A line with a width of 100 microns was measured and found to be printed as a line with a width of 128 microns.

After three months from the preparation of the photopolymer plate, the evaluation of the print quality was carried out in the same manner as that after one day from the preparation whereby it was found that the print was with little thickening and the letters were sharp as well. A line with a width of 100 microns was measured and found to be printed as a line with a width of 135 microns.

EXAMPLE 4

A nylon salt (575 parts) from 305 parts of adipic acid, 270 parts of N-(2-aminoethyl)piperazine and 500 parts of epsilon-caprolactam together with 40 parts of N-(2-aminoethyl)piperazine (an agent for animating the terminals and also as a polymerization controlling agent) were subjected to a melt polycondensation in an autoclave to give a pale yellow, transparent and alcohol-soluble copolymerized nylon oligomer (a specific viscosity: 1.40; an average molecular weight: about 3,050) in which both terminals were substantially primary and/or secondary amino groups.

On the other hand, 750 parts of polypropylene glycol was made to react with 300 parts of hexamethylene diisocyanate to give a urethane oligomer having isocyanate groups substantially at both terminals. Then 92 parts of the above-prepared copolymerized nylon oligomer and 0.05 part of the sensivity controlling agent used in Example 1 (the aminonaphthoquinone derivative) were dissolved in 200 parts of methanol and 18 parts of the above urethane oligomer was gradually poured into the nylon oligomer with stirring at 50° C. The reaction between them was completed within about 15 minutes. viscosity of the reaction solution was about 180 poises. The resulting pale yellow and transparent solution was placed into a Petri dish which was coated with Teflon and methanol was evaporated therefrom to give a polymer having an amide bond, urethane bond and urea bond in a molecule which had a specific viscosity of 2.20, pale yellow, semitransparent, soft, elastic and substantially insoluble in neutral water.

The resulting polymer (55 parts) was dissolved in 200 parts of methanol of 60° C., 2 parts of glycidyl methacrylate was added thereto and the mixture was stirred for three hours so that the glycidyl methacryate was made to react with the polymer terminals. After that, 34 parts of diacrylate (prepared by a ring-opening addition reaction of acrylic acid with diglycidyl ether of polyethylene glycol of an average molecular weight of 400), 5 parts of N-butylbenzene sulfonamide, 0.1 part of hydroquinone monomethyl ether and 1.0 part of benzyl dimethyl ketal were added thereto to give a solution of a photosensitive resin composition. This photosensitive resin composition solution was coated on a polyester film (thickness: 125 microns; coated with poval of degree of polymerization of 98% to a thickness of about 1.6 microns) using a wire bar and dried in a drier of 100° C. for three minutes to give a film which was coated with 40 microns of a photosensitive resin composition containing a polymer to which a sensitivity lowering agent was bonded.

On the other hand, the lower layer was prepared as follows. Thus, 92 parts of copolymerized nylon oligomer (an average molecular weight: about 3,050; pale yellow and transparent; soluble in alcohol; both terminals thereof were substantially primary and/or secondary amino groups) which was prepared by a melt polycondensation of 575 parts of a nylon salt from 305 parts of adipic acid, 270 parts of N-(2-aminoethyl)piperazine and 500 parts of epsilon-caprolactam together with 40 parts of N-(2-aminoethyl)-piperazine (as a terminal animating agent and also as an agent for controlling the degree of polymerization) in an autoclave was dissolved in 200 parts of methanol of 60° C. In the meanwhile, oligomer having isocyanate groups substantially at both terminals was prepared by the reaction of 750 parts of polypropylene glycol (average molecular weight: 1,000) with 300 parts of hexamethylene diisocyanate. Then 90 parts of the above obtained copolymerized nylon oligomer were dissolved in 200 parts of methanol and then 18 parts of the above urethane oligomer was, gradually poured into a nylon oligomer solution with stirring at 50° C. to give a polymer. The resulting polymer (55 parts) was dissolved in 200 parts of methanol of 60° C., 2 parts of glycidyl methacrylate was added and the mixture was stirred for three hours so that glycidyl methacrylate was made to react with the polymer terminals. After that, 29 parts of diacrylate prepared by a ring-opening addition reaction of acrylic acid with diglycidyl ether of polyethylene glycol (average molecular weight: 400), 4 parts of adipic acid for producing quaternary ammonium salts with the terminal amino groups of the polymer and the tertiary nitrogen atoms, 15 parts of N-butylbenzene sulfonamide, 0.1 part of hydroquinone monomethyl ether and 1.0 part of benzyl dimethyl ketal were added thereto to give a solution of a photosensitive resin composition. The solution was poured into a Petri dish which was coated with Teflon, methanol was removed therefrom by evaporation in a dark place and the residue was dried in vacuo at 40° C. for a whole day and night to give a sheet of the composition with a thickness of about 800 microns. The sheet was stuck together with a polyester film with a thickness of 188 microns applied with an adhesive containing a brown pigment, then covered with the above-mentioned cover film in which the upper surface of the composition was laminated to a thickness of 40 microns with a photosensitive resin composition containing a polymer bonded with a sensitivity controlling agent and subjected to a thermal compression to give a photopolymer plate in which the thickness of the photosensitive resin layer was about 700 microns.

Then the cover film was detached from this plate, then a negative film was closely sticked to the surface of the photosensitive resin layer, exposed to light by means of a chemical lamp, the negative film was detached, developed with a neutral water in a brush type washer for 2 minutes and 10 seconds, dried and exposed to light to give a relief. After one day from the preparation of the unexposed photopolymer plate, a cover film was detached from the plate, a negative film was closely stuck to the surface of the photosensitive resin layer, exposed to light by means of a chemical lamp, the negative film was detached, developed with a neutral water in a brush type washer for 2 minutes and 25 seconds, dried and exposed to light to give a relief. The print quality of this relief was evaluated and it was found that the print had little thickening and the letters were sharp as well. When a line with a width of 100 microns was measured, it was found to be printed as a line with a width of 134 microns. After three months from the preparation of the photopolymer plate, the print quality was evaluated in the same manner as that of one day after the preparation and it was found that the print had little thickening and the letters were sharp as well. When the width of a line of 100 microns was measured, it was found to be printed as a line with a width of 130 microns.

EXAMPLE 5 epsilon-Caprolactam (500 parts), 450 parts of N,N'-bis(3-aminopropyl)piperazine adipate and 50 parts of 1,3-bis(amino-methyl)cyclohexane adipate were subjected to a melt polymerization to give a polyamide containing tertiary nitrogen atoms with a specific viscosity of 2.40. The resulting polyamide (55 parts) was dissovled in 200 parts of methanol of 70° C. and 0.05 part of an aminonaphthoquinone derivative (a sensitivity balancing agent) having an isocyanate group represented by the following structural formula was gradually added with stirring to give a polyamide in

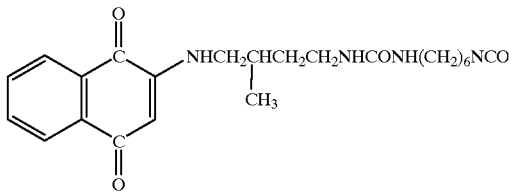

which the sensitivity balancing agent was fixed at a part of the polymer terminals. Then 39 parts of a diacrylate prepared by a ring-opening addition reaction of acrylic acid with diglycidyl ether of trimethylolpropane, 5 parts of N-butylbenzene sulfonamide, 0.1 part of hydroquinone monomethyl ether and 1.0 part of benzyl dimethyl ketal were added to give a solution of a photosensitive resin composition. This photosensitive resin composition solution was coated on a polyester film with a thickness of 125 microns (coated with poval of degree of saponification of 98% to a thickness of about 1.6 microns) using a wire bar and dried in a drier of 100° C. to give a cover film which was laminated with 40 microns of the photosensitive resin composition containing a polymer bonded with the sensitivity balancing agent.

In the meanwhile, the lower layer was prepared as follows. Thus, 500 parts of epsilon-caprolactam, 450 parts of N,N'-bis(3-aminopropyl)piperazine adipate and 50 parts of 1,3-bis(amino-methyl)cyclohexane adipate were subjected to a melt polymerization to give a polyamide containing tertiary nitrogen atoms with a specific viscosity of 2.40. The resulting polyamide (55 parts) was dissolved in 200 parts of methanol of 70° C., 2 parts of glycidyl methacrylate was added and the mixture was stirred for three hours so that glycidyl methacrylate was made to react with the polymer terminals. After that, 36 parts of diacrylate prepared by a ring-opening addition reaction of acrylic acid with diglycidyl ether of trimethylolpropane, 3 parts of methacrylic acid which is capable of forming quaternary ammonium salts with terminal amino groups of the polymer and tertiary nitrogen atoms, 5 parts of N-butylbenzene sulfonamide, 0.1 part of hydroquinone monomethyl ether and 1.0 part of benzyl dimethyl ketal were added to give a solution of the photosensitive resin composition. The solution was poured into a Petri dish which was coated with Teflon, methanol was removed therefrom by evaporation in a dark place and dried in vacuo at 40° C. for a whole day and night to give a sheet of the composition with a thickness of about 800 microns. The sheet was adhered with a polyester film with a thickness of 350 microns coated with an adhesive containing a brown pigment, then covered with the above-mentioned cover film whose surface was coated to a thickness of 40 microns with the photosensitive resin composition containing the polymer bonded with the sensitivity balancing agent and subjected to a thermal compression at 110° C. to give a photopolymer plate in which the thickness of the photosensitive resin layer was about 600 microns.

Then the cover film was detached from this unexposed photo-polymer plate, a negative film was closely stuck to the surface of the photosensitive resin layer, exposed to light by means of a chemical lamp for three minutes, the negative film was detached, developed with a neutral water in a brush type washer for 1 minute and 50 seconds, dried and exposed to light to give a relief.

After one day from the preparation of the photopolymer plate, the cover film was detached from this plate, a negative film was closely stuck to the surface of the photosensitive resin layer, exposed to light by means of a chemical lamp for three minutes, the negative film was detached, developed with a neutral water in a brush type washer for 2 minutes and 25 seconds, dried and exposed to light to give a relief. The print quality of this relief was evaluated and it was found that the print had little thickening and the letters were sharp as well. When a line with a width of 100 microns was measured, it was found to be printed as a line with a width of 126 microns.

After three months from the preparation of the photopolymer plate, its print quality was evaluated in the same manner as that after one day whereby it was found that the print was with little thickening and the letters were sharp as well. When a line with a width of 100 microns was measured, it was found to be printed as a line with a width of 121 microns.

In the multilayered photopolymer element of the present invention comprising the above-mentioned characteristic features, the shape of the relief after developing is sharp-edged independently of the hardness of the photosensitive resin layer per se whereby the original image can be faithfully reproduced. Further, even when the element is stored for long time, there is no change in its quality and, consequently, the present invention greatly contributes to the industry.

What we claim is:

1. A multilayered photopolymer element comprising:
   at least a support;
   at least two adjacent photosensitive layers, and
   a cover film,
   wherein the uppermost photosensitive layer contains a sensitivity controlling agent bonded with a polymer,
   wherein said sensitivity controlling agent, which inhibits or terminates polymerization, is at least one of:
   a compound that can inhibit thermal polymerization;
   a compound that absorbs ultraviolet radiation, and
   a compound that increases sensitivity balance,
   wherein said sensitivity controlling agent has one or more functional group(s) capable of reacting with the polymer.

2. The multilayered photopolymer element of claim 1 in which the polymer is a polyether amide.

3. The multilayered photopolymer element of claim 1 in which the polymer is a polyether ester amide.

4. The multilayered photopolymer element of claim 1 in which the polymer is a polyamide containing a tertiary nitrogen.

5. The multilayered photopolymer element of claim 1 in which the polymer is a polyamide containing a quaternary nitrogen.

6. The multilayered photopolymer element of claim 1 in which the polymer is an addition polymer of an organic diisocyanate with a diamine having an amide bond.

7. The multilayered photopolymer element of claim 1 in which the polymer is an addition polymer of an organic diisocyanate with a diamine having no amide bond.

8. The multilayered photopolymer element of claim 1, in which there are sensitivity controlling agents selected from the group consisting of (i) a compound that can inhibit thermal polymerization and a compound that absorbs ultraviolet light, (ii) a compound that can inhibit thermal polymerization and a compound that increases sensitivity balance, and (iii) a compound that absorbs ultraviolet radiation and a compound that increases sensitivity balance.

9. The multilayered photopolymer element of claim 1, in which the sensitivity controlling agents are at least one each of (i) a compound that absorb ultraviolets radiation, (ii) a compound that can inhibit thermal polymerization and (iii) a compound that increases sensitivity balance.

* * * * *